(12) United States Patent
Yamane et al.

(10) Patent No.: US 7,660,153 B2
(45) Date of Patent: Feb. 9, 2010

(54) MEMORY DEVICE AND MEMORY

(75) Inventors: Kazutaka Yamane, Kanagawa (JP);
Masanori Hosomi, Kanagawa (JP);
Hiroyuki Ohmori, Kanagawa (JP);
Tetsuya Yamamoto, Kanagawa (JP);
Yutaka Higo, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 12/014,478

(22) Filed: Jan. 15, 2008

(65) Prior Publication Data

US 2008/0225581 A1  Sep. 18, 2008

(30) Foreign Application Priority Data

Mar. 15, 2007  (JP) .............................. 2007-066907

(51) Int. Cl.
*G11C 11/14* (2006.01)
(52) U.S. Cl. ...................... 365/171; 365/173; 365/158
(58) Field of Classification Search ................. 365/171, 365/158, 173
See application file for complete search history.

(56) References Cited

U.S. PATENT DOCUMENTS

| 6,256,223 | B1 | 7/2001 | Sun | |
| 6,992,359 | B2 * | 1/2006 | Nguyen et al. | 257/421 |
| 7,170,778 | B2 * | 1/2007 | Kent et al. | 365/171 |
| 7,366,010 | B2 * | 4/2008 | Hosobuchi | 365/158 |
| 2002/0044479 | A1 | 4/2002 | Ikeda | |
| 2002/0105827 | A1 | 8/2002 | Redon et al. | |
| 2005/0018439 | A1 | 1/2005 | Schevardo et al. | |
| 2005/0184839 | A1 | 8/2005 | Nguyen et al. | |
| 2006/0108620 | A1 | 5/2006 | Rizzo et al. | |

FOREIGN PATENT DOCUMENTS

| JP | 2003-17782 | 1/2003 |
| JP | 2003-017782 | 1/2003 |
| JP | 2004-221526 | 8/2004 |
| JP | 2006-165059 | 6/2006 |
| JP | 2006-165265 | 6/2006 |
| JP | 2007-059879 | 3/2007 |

OTHER PUBLICATIONS

Berger, L., "Emission of Spin Waves by a Magnetic Multilayer Traversed by a Current," Physical Review B, vol. 54, No. 13, pp. 9353-9358 (1996).
Slonczewski, J.C., "Current-Driven Excitation of Magnetic Multilayers," Journal of Magnetism and Magnetic Materials, vol. 159, pp. L1-L7 (1996).
Albert, F.J., "Spin-Polarized Current Switching of a Co Thin Film Nanomagnet," Applied Physics Letters, vol. 77, No. 23, pp. 3809-3811 (2000).
Japanese Office Action issued on Sep. 29, 2009, for corresponding Japanese Patent Application JP 2007-066907.

* cited by examiner

*Primary Examiner*—Connie C Yoha
(74) *Attorney, Agent, or Firm*—K&L Gates LLP

(57) ABSTRACT

A memory device is provided. The memory device includes a memory layer and a fixed-magnetization layer. The memory layer retains information based on a magnetization state of a magnetic material. The fixed-magnetization layer is formed on the memory layer through an intermediate layer made of an insulating material. The information is recorded on the memory layer with a change in a magnetization direction of the memory layer caused by injecting a spin-polarized electron in a stacked direction. A level of effective demagnetizing field, which is received by the memory layer, is smaller than a saturation-magnetization level of magnetization of the memory layer.

1 Claim, 5 Drawing Sheets

3

20

MEMORY DEVICE AND MEMORY

CROSS REFERENCES TO RELATED APPLICATIONS

The present application claims priority to Japanese Patent Application JP 2007-066907 filed in the Japanese Patent Office on Mar. 15, 2007, the entire contents of which is being incorporated herein by reference.

BACKGROUND

The present application relates to a memory device including a memory layer storing a magnetization state of a ferromagnetic layer and a fixed-magnetization layer with a fixed magnetization direction, where the magnetization direction of the memory layer is changed by flow of an electric current. The present application also relates to a memory including such a memory device, which is suitably applied to a nonvolatile memory.

A high-density DRAM, which can be operated at high speed, has been used as a random access memory in information equipment, such as a computer.

However, the DRAM is a volatile memory from which information disappears when the power is turned off. Therefore, a nonvolatile memory, from which information does not disappear, have been demanded.

Furthermore, as a candidate of the nonvolatile memory, attention has been paid on a magnetic random access memory (MRAM) in which information is recorded based on magnetization of a magnetic material. Thus, the development of MRAM has been progressed.

MRAM allows electric current to pass through each of two different address wiring lines (a word line and a bit line) which are approximately perpendicular to each other to generate an electric field of electric current from each address wiring line. The current magnetic field inverts a magnetization of the magnetic layer of the magnetic memory device located at the intersection of address wiring lines to record information.

FIG. 1 shows a schematic diagram (perspective view) of a MRAM typically used in the related art.

A drain region 108, a source region 107, and a gate electrode 101, which constitute a selection transistor for selecting each memory cell, are formed on a portion separated by a device-separating layer 102 of a semiconductor substrate 110, such as a silicon substrate.

In addition, a word line 105 extends in the depth direction as shown in the drawing and is located above the gate electrode 101.

The drain region 108 is formed so that it can be used in common by selection transistors located on the right and left sides as shown in FIG. 1. The drain region 108 is connected to a wiring line 109.

Furthermore, a bit line 106 extends in the transverse direction as shown in the figure and is located above the word line 105. A magnetic memory device 103 having a memory layer, in which a magnetization direction is reversed, is arranged between the word line 105 and the bit line 106. The magnetic memory device may be, for example, formed of a magnetic tunnel junction device (MTJ device).

Furthermore, the magnetic memory device 103 is electrically connected to a source region 107 through a horizontally-extending bypass line 111 and a vertically-extending contact layer 104.

An electric current flows through each of the word line 105 and the bit line 106 to apply a current magnetic field to the magnetic memory device 103. As a result, the magnetization direction of the memory layer in the magnetic memory device 103 can be reversed, thereby recording information.

Furthermore, the magnetic layer (memory layer) for recording information may need to have a predetermined magnetic coercive force for stably retaining the information recorded in the magnetic memory, such as MRAM.

On the other hand, a certain level of an electric current should be passed through the address wiring line for rewriting the recorded information.

However, the address wiring line is thinly formed with the device in MRAM being miniaturized. Thus, a sufficient electric current is hardly passed through the address wiring line.

Attention has been focused on a memory, in which a magnetization direction is reversed with a spin injection, as one in which the magnetization direction can be reversed with a less level of an electric current (see, for example, Japanese Unexamined Patent Application Publication No. 2003-17782 (JP 2003-17782 A), U.S. Pat. No. 6,256,223, U.S. Patent Application Publication No. 2005-018439 A1, PHYs. Rev. B., 54.9353 (1996), and J. Magn. Mat., 159, L1 (1996)).

Reversing the magnetization direction with a spin injection is carried out such that a spin-polarized electron passed through a magnetic material is then injected into the other magnetic material to reverse the magnetization direction of the other magnetic material.

For example, an electric current is perpendicularly passed through the film surface of each of a giant magnetoresistive device (GMR device) and a magnetic tunnel junction device (MTJ device) to reverse the magnetization direction of at least part of the magnetic layer of these devices.

Furthermore, reversing the magnetization direction with a spin injection has an advantage in that the magnetization direction can be reversed without increasing an electric current even if the device is miniaturized.

Referring now to FIG. 2 and FIG. 3, the configuration of a memory in which a magnetization direction is reversed with a spin injection as described above will be described. FIG. 2 is a perspective view of the memory and FIG. 3 is a cross sectional view of the memory.

Device-separating layers 52 separate a semiconductor substrate 60, such as a silicon substrate, into parts. The separated part is provided with a selection transistor for selecting each memory cell. In other words, the selection transistor includes a drain region 58, a source region 57, and a gate electrode 51. The gate electrode 51 also functions as a word line extending in the depth direction as shown in FIG. 2.

The drain region 58 is formed so that it can be used in common by selection transistors located on the right and left sides as shown in FIG. 2. The drain region 58 is connected to a wiring line 59.

Furthermore, a memory device 53 having a memory layer with a magnetization direction to be reversed with a spin injection is arranged between the source region 57 and a bit line 56. Here, the bit line 56 extends in the traverse direction as shown in FIG. 2 and is arranged above the source region 57.

The memory device 53 is, for example, formed of a magnetic tunnel junction (MTJ) device. In the figure, the reference numerals 61 and 62 denote magnetic layers, respectively. One of the two magnetic layers 61, 62 is provided as a fixed-magnetization layer with a fixed magnetization direction and the other is provided as a free-magnetization layer on which the direction of magnetization can be changed.

In addition, the memory device 53 is connected to both the bit line 56 and the source region 57 through upper and lower contact layers 54, respectively. Therefore, the magnetization direction can be reversed with a spin injection by passing an electric current through the memory device 53.

Such a memory in which a magnetization direction is reversed with a spin injection has a simplified device structure in comparison with the typical MRAM illustrated in FIG. 1, so that the memory has an advantage of being integrated in high density.

In addition, when a magnetization direction is reversed with a spin injection, electric current for writing may not increase even the miniaturization of an element is progressed in comparison with the typical MRAM in which a magnetization direction is reversed with an external magnetic field.

In MRAM, writing lines (word lines and bit lines) for writing are formed in addition to a memory device so as to write (record) information by a current magnetic field generated by passing an electric current through each of the writing wiring lines. Thus, it is possible to feed a sufficient amount of electric current required for writing information into the writing line.

On the other hand, in the case of a memory in which a magnetization direction is reversed with a spin injection, the magnetization direction of a memory device may be reversed by the spin injection with an electric current passing through a memory device.

As described above, information can be written (recorded) by directly feeding an electric current to the memory device. Thus, a memory cell may be formed by connecting a memory device to a selection transistor so as to select the memory cell where the information is recorded. In this case, an electric current passing through the memory device is restricted to a certain level of electric current (saturated electric current of selection transistor) that is passed through the selection transistor.

Therefore, writing may need to be carried out with an electric current lower than the saturated electric current of the selection transistor. Accordingly, the efficiency of spin injection may need to be improved to lower the electric current passing through the memory device.

In order to increase the level of a read signal, it may be necessary to secure a high rate of magnetic resistance change. Thus, it is effective to provide a memory device with intermediate layers in contact with both sides of a memory layer as a tunnel insulating layer (tunnel barrier layer).

When the tunnel insulating layer is used as an intermediate layer as described above, the amount of an electric current passing through the memory device may be restricted to prevent the tunnel insulating layer from dielectric breakdown. From this point of view, it may be necessary to control the electric current in the spin injection.

The electric current level is proportional to the film thickness of the memory layer and the square of saturated magnetization of the memory layer. Thus, these factors (the film thickness and the saturation magnetization of the memory layer) may be adjusted in order to lower the electric current level (see, for example, F. J. Albert et al., Appl. Phy. Lett., 77,3809 (2000)). In addition, for example, Nguyen et al. discloses that the electric current level can be decreased by lowering the magnetization level (Ms) of a recording material (see, for example, U.S. Patent Application Publication No. 2005-018439 A1).

However, on the other hand, the memory may function when storing information written by such electric current. In other words, the stability of a memory layer to heat fluctuation (thermal stability) may need to be secured.

The memory device in which a magnetization direction is reversed with a spin injection has a small volume of the memory layer in comparison with the MRAM in the past. Thus, it can be considered that the thermal stability may be decreased.

If the thermal stability of the memory layer may not be secured, the reversed magnetization direction may be reversed again by heat and a writing error may thus occur.

Therefore, thermal stability is an important characteristic for the memory device using the magnetization reversal with a spin injection.

Therefore, for allowing the memory device in which a magnetization direction of a memory layer is reversed with a spin injection to act as a memory, an electric current required to reverse the magnetization with a spin injection may be reduced to the saturated electric current or less. In addition, it may be also required to ensure thermal stability for firmly retaining the written information.

SUMMARY

An electric current to reverse a magnetization direction with a spin injection may be reduced by lowering the saturation-magnetization level Ms of the memory layer or thinning the memory layer.

For instance, the material of the memory layer, which can be advantageously used, may be a material with a low saturation-magnetization level Ms as described in U.S. Patent Application Publication No. 2005-018439 A1.

However, it is difficult to secure thermal stability for firmly retaining information when a material having a low saturation-magnetization level Ms is simply used as described above.

It is desirable to provide a memory device capable of improving thermal stability without causing an increase in writing electric current and a memory having such a memory device.

According to an embodiment, there is provided a memory device. The memory device includes: a memory layer retaining information based on a magnetization state of a magnetic material; and a fixed-magnetization layer formed on the memory layer through an intermediate layer made of an insulating material. In the memory device, the information is recorded on the memory layer with a change in magnetization direction of the memory layer caused by injecting a spin-polarized electron in a stacked direction. In addition, a level of effective demagnetizing field, which is received by the memory layer, is smaller than a saturation-magnetization level of magnetization of the memory layer.

According to another embodiment, there is provided a memory. The memory includes: a memory device having a memory layer retaining information based on a magnetization state of a magnetic material; and two different wiring lines perpendicular to each other. In the memory, the memory device includes a fixed-magnetization layer on the memory layer through an intermediate layer. Here, the intermediate layer includes an insulating material and the information is recorded on the memory layer with a change in a magnetization direction of the memory layer caused by injecting a spin-polarized electron in a stacked direction. A level of effective demagnetizing field, which is received by the memory layer, is smaller than a saturation-magnetization level of magnetization of the memory layer. The memory device is arranged between the two different wiring lines in the vicinity of the intersection of the two different wiring lines. An electric current flows into the memory device in a stacked direction through the two different lines to inject a spin-polarized electron.

The memory device according to the embodiment is provided with a memory layer retaining information based on a magnetization state of a magnetic material. The memory layer is provided with a fixed-magnetization layer through an intermediate layer made of an insulating material. Thus, the injection of a spin-polarized electron in a stacked direction causes a change in magnetization direction of the memory layer, thereby recording the information on the memory device. In other words, a spin-polarized electron is injected by feeding an electric current in a stacked direction, thereby recording the information.

In addition, the level of effective demagnetizing field, which is received by the memory layer, is smaller than a saturation-magnetization level of magnetization of the memory layer. The demagnetizing field received by the memory layer is low, so that the amount of a writing electric current, which may be required for reversing the magnetization direction of the memory layer, can be reduced.

On the other hand, the amount of a writing electric current can be reduced without reducing the saturation-magnetization level of the memory layer. Accordingly, a sufficient thermal stability of the memory device can be secured while retaining a sufficient saturation-magnetization level of the memory layer.

The memory according to an embodiment includes: a memory device having a memory layer retaining information based on the magnetization state of a magnetic material; and two different wiring lines perpendicular to each other. In this case, the memory device is one according to the above-described embodiment. The memory device is arranged between the two different wiring lines in the vicinity of the intersection of the two different wiring lines. An electric current flows into the memory device in the stacked direction through the two different lines to inject a spin-polarized electron. Therefore, information can be recorded by the spin injection caused by feeding an electric current in a stacked direction of the memory device through two different wiring lines.

In addition, the amount of a writing electric current can be reduced without lowering the saturation-magnetization level of the memory device. The information recorded on the memory device can be stably retained while the power consumption of the memory is reduced.

According to an embodiment, as described above, the amount of a writing electric current for the memory device can be reduced without lowering the saturation-magnetization level of the memory layer. Therefore, the memory device can be provided with excellently balanced characteristics while sufficiently securing its thermal stability representing an ability of retaining information.

Consequently, the memory device can be prevented from causing an operation error, thereby obtaining a sufficient operation margin thereof.

Thus, a reliable memory, which is stably operated, can be obtained.

In addition, the power consumption of the memory device in writing can be reduced by lowering the amount of a writing electric current.

Thus, the consumption power of the whole memory can be reduced.

Additional features and advantages are described herein, and will be apparent from, the following Detailed Description and the figures.

DETAILED DESCRIPTION

Figure 1:
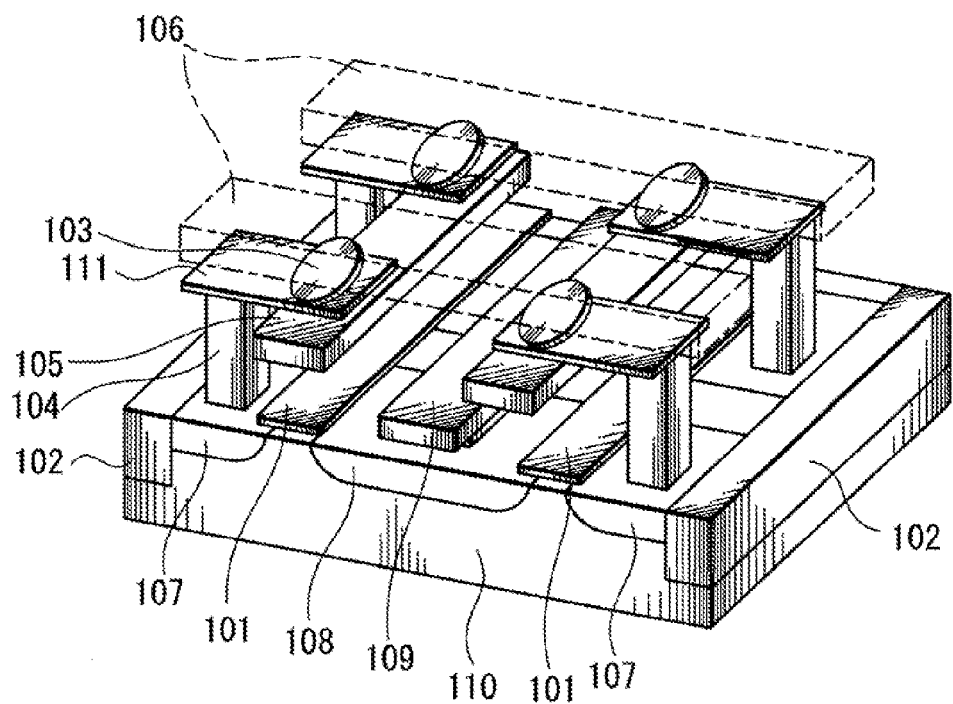
FIG. 1 is a schematic perspective diagram illustrating the configuration of a MRAM according to related art.
Figure 2:
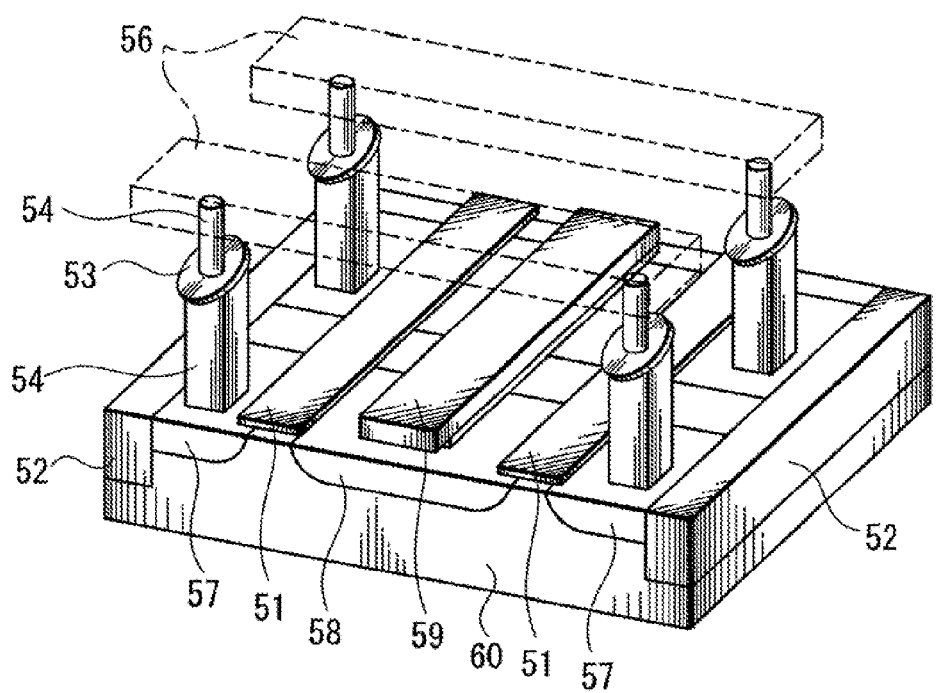
FIG. 2 is a schematic perspective diagram illustrating the configuration of a memory in which a magnetization direction is reversed with a spin injection.
Figure 3:
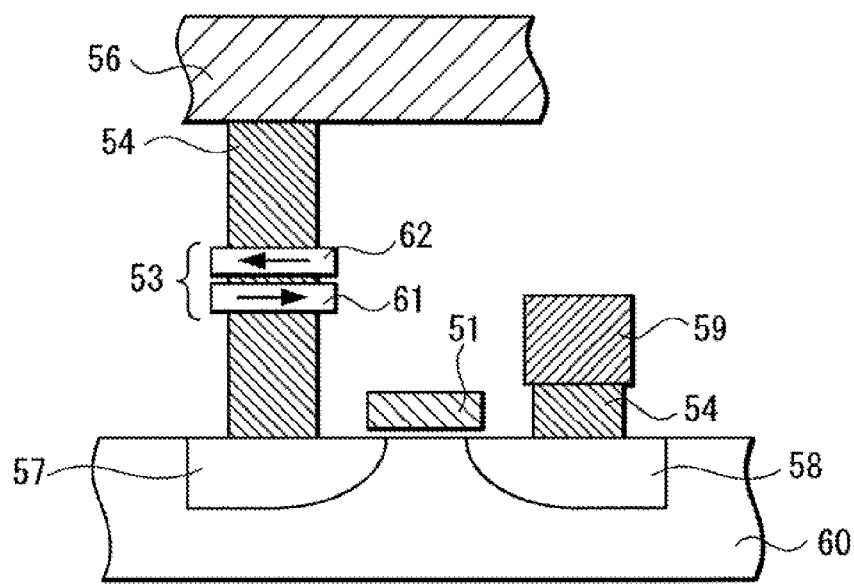
FIG. 3 is a cross sectional view of the memory illustrated in FIG. 2.

According to an embodiment, information is recorded by reversing a magnetization direction of a memory layer of a memory device with the aforementioned spin injection. The memory layer includes a magnetic material such as a ferromagnetic layer and retains information based on the magnetization state (magnetization direction) of a ferromagnetic material.

A basic operation of reversing the magnetization direction of the magnetic layer with the spin injection is obtained by the flow of an electric current. That is, an electric current at a predetermined threshold or more is fed to a memory device in the direction perpendicular to the film surface thereof. Here, the memory device may be a giant magnetoresistive device (GMR device) and a magnetic tunnel junction device (MTJ device). In this case, the polarity (direction) of the electric current depends on the magnetization direction to be reversed. The magnetization direction is not reversed when the absolute level of the electric current is smaller than the threshold.

The threshold Ic of the electric current for reversing the magnetization direction of the magnetic layer with the spin injection is represented by the following equation (1):

$$Ic = A \cdot \alpha \cdot M_S \cdot V \cdot Hd/2\eta \quad (1)$$

wherein A represents a constant, $\alpha$ represents a spin-braking constant, $\eta$ represents spin-injection efficiency, Ms represents a saturation-magnetization level, V represents the volume of the memory layer, and Hd represents an effective demagnetizing field.

As represented by the equation (1), the threshold of the electric current can be optionally determined by controlling the volume of the magnetic layer, the saturation magnetization Ms, spin-injection efficiency $\eta$, and spin-braking constant a of the magnetic layer.

According to an embodiment, a memory device includes a magnetic layer (memory layer) which is capable of retaining information based on a magnetization state thereof and a fixed-magnetization layer with a fixed magnetization direction.

For allowing the memory device to be provided as a memory, written information may need to be retained. A value of $\Delta(=KV/k_B T)$, which is indicative of thermal stability, can be used for determining the ability of retaining information. The value $\Delta$ is represented by the following equation (2):

$$\Delta = KV/k_B T = Ms \cdot V \cdot H_k \cdot (1/2 k_B T) \qquad (2)$$

wherein $H_k$ represents an effective anisotropy field, $K_B$ represents the Boltzmann constant, T represents a temperature, Ms represents a saturation-magnetization level, and V represents the volume of the memory layer.

The effective anisotropy field $H_k$ incorporates the effects of magnetic shape anisotropy, induced magnetic anisotropy, magneto-crystalline anisotropy, and so on. The effective anisotropy field $H_k$ is equal to a magnetic coercive force when the coherent low-tension model of a single magnetic domain is assumed.

In many cases, the index $\Delta$ of thermal stability and the threshold Ic of electric current may be in a tradeoff relation. Therefore, in order to maintain the characteristics of a memory, the coexistence of such factors serves as a subject in many cases.

The threshold of electric current that causes a change in magnetization state of the memory layer is actually, for example, as follows:

In the case of a TMR device in an approximately ellipse shape having a memory layer of 2 nm in thickness and a flat pattern of 100 nm×150 nm, the threshold on the plus (+) side is +0.5 mA (+Ic=+0.5 mA) and the threshold on the minus (−) side is −0.3 mA (−Ic=−0.3 mA). The electric current density in that case is about $3.5 \times 10^6$ A/cm$^2$. These are mostly in agreement with the above-mentioned equation (1).

In contrast, the typical MRAM in which a magnetization direction is reversed with a current magnetic field may require several milliamperes or more of writing electric current.

Therefore, it is found that reversing a magnetization direction with a spin injection is effective to reduce the power consumption of an integrated circuit because of sufficiently reducing the threshold of the writing electric current as described above.

Accordingly, in the case of reversing the magnetization direction with the spin injection, there may be no need of an wiring line for generating a current magnetic field as required in the typical mRNA (such as one denoted by the reference numeral 105 in FIG. 1). Thus, reversing the magnetization direction with the spin injection is also advantageous in integration in comparison with the typical MRAM.

For reversing the magnetization direction with the spin injection, an electric current is directly fed to the memory device to write (record) information. Thus, for selecting a memory cell that performs a writing operation, the memory cell is formed by connecting the memory device to a selection transistor.

In this case, an electric current passing through the memory device is restricted by the amount of electric current which can be fed to the selection transistor (i.e., saturated electric current of the selection transistor).

For obtaining the threshold Ic of the electric current for reversing the magnetization direction with the spin injection smaller than the saturated electric current of the selection transistor, it is understood from the equation (1) that the saturation-magnetization level Ms of the memory layer may be reduced.

However, when the saturation-magnetization level Ms is simply reduced without any consideration (for example, see U.S. Patent Application Publication No. 2005-018439 A1), the thermal stability of the memory layer may be unfavorably reduced. As a result, it is hard to function as a memory.

Thus, the memory may need to have a predetermined level or more of the index $\Delta$ of thermal stability.

In consideration of such circumstances, inventors of the present application have carried out various studies and found out the following fact. The level of effective demagnetizing field ($M_{effective}$) received by the memory layer is smaller than the saturation-magnetization level Ms of the memory layer by selecting a material for the ferromagnetic layer that constitutes the memory layer or a material for a layer adjacent to the memory layer.

As described above, according to an embodiment, the level of effective demagnetizing field received by the memory layer is smaller than the saturation-magnetization level Ms of the memory layer. Accordingly, the threshold Ic of the electric current represented by the equation (1) can be reduced without reducing the thermal stability $\Delta$ represented by the equation (2).

Therefore, according to an embodiment, a stable memory capable of writing information with a small amount of electric current while retaining thermal stability can be formed.

In order to decrease the level of effective demagnetizing field received by the memory layer so as to be smaller than the saturation-magnetization level Ms of the memory layer, there are three methods as follows: (1) The composition of a ferromagnetic material in the memory layer is changed. (2) A nonmagnetic material is added to the ferromagnetic material in the memory layer. (3) A nonmagnetic layer having a property of reducing a demagnetizing field is formed in contact with the memory layer opposite the intermediate layer.

For changing the composition of the ferromagnetic material in the memory layer, for example, the content of Fe may be increased in a CoFe alloy or a CoFeB ally while the content of Co may be decreased.

In the case of adding the nonmagnetic material to the ferromagnetic material in the memory layer, for example, a nonmagnetic metal element, such as Cr, Ta, or Hf, or a nonmagnetic alloy thereof, or a nonmetallic magnetic material, such as MgO or $Ta_2O_5$ may be added.

In the case of forming the nonmagnetic layer having a property of reducing a demagnetizing field in contact with the memory layer opposite the intermediate layer, the material of the nonmagnetic layer may be, for example, a nonmagnetic metal, such as Ru, or a nonmetallic material, such as magnesium oxide (MgO) or aluminum oxide.

According to an embodiment, the level of effective demagnetizing field received by the memory layer is smaller than the saturation-magnetization level Ms of the memory layer. In other words, the ratio of the saturation-magnetization level Ms of the memory layer to the level of effective demagnetizing field is larger than 1.

More preferably, the ratio of the saturation-magnetization level Ms of the memory layer to the level of effective demagnetizing field is 1.15 or more.

Further, according to an embodiment, the amount of a saturated electric current of the selection transistor is considered. Thus, a magnetic tunnel junction (MTJ) device may be formed using a tunnel insulating layer made of an insulating material as a nonmagnetic intermediate layer between a memory layer and a fixed-magnetization layer.

As the magnetic tunnel junction (MTJ) device is formed using the tunnel insulating layer, a high rate of magnetic resistance change (MR ratio) can be attained in comparison with a giant magnetoresistive (GMR) device, thereby increasing a readout signal strength.

Furthermore, in particular, magnesium oxide (MgO) may be used as a material of the tunnel insulating layer. In this case, a high rate of magnetic resistance change (MR ratio) can be obtained in comparison with one typically using aluminum oxide.

Furthermore, in general, the spin-injection efficiency depends on the MR ratio. The more the MR ratio increases, the more the spin-injection efficiency is improved. Thus, the current density for reversing the magnetization direction can be decreased.

Therefore, magnesium oxide may be used as a material of the tunnel insulating layer as an intermediate layer while the memory layer as described above may be simultaneously used. As a result, the threshold writing current with a spin injection can be reduced and information can be thus written (recorded) with a less amount of electric current. Furthermore, the readout signal strength can be enhanced.

Consequently, the MR ratio (TMR ratio) can be secured and the threshold writing current with a spin injection can be decreased. Thus, the threshold writing current with a spin injection can be reduced and information can be thus written (recorded) with a less amount of electric current. Furthermore, the readout signal strength can be enhanced.

As described above, when the tunnel insulating layer is formed of a magnesium oxide (MgO) film, it is preferable to crystallize the MgO film and the crystal orientation in the [001] direction.

Furthermore, according to an embodiment, the intermediate layer (tunnel insulating layer) between the memory layer and the fixed-magnetization layer may be made of magnesium oxide. Alternatively, it may be made of any of various insulating materials, dielectric materials, and semiconductor materials, such as $SiO_2$, $Bi_2O_3$, $MgF_2$, $CaF$, $SrTiO_2$, $AlLaO_3$, and Al—N—O.

The area resistance value of the tunnel insulating layer may need to be adjusted to about several tens $\Omega \cdot \mu m^2$ or less in terms of obtaining an electric current density for reversing the magnetization direction with the spin injection with a spin injection.

Furthermore, the tunnel insulating layer made of a MgO film may need to have a MgO film of 1.5 nm or less in thickness to obtain an area resistance value within the above range. In addition, the memory device may be favorably made small so that the magnetization direction of the memory layer can be readily reversed with a small amount of electric current. Therefore, the area of the memory device is preferably 0.04 $\mu m^2$ or less.

Furthermore, it is possible to directly stack the memory layer that satisfies the above structural conditions and another ferromagnetic layer having a different material or composition range from each other. Alternatively, the ferromagnetic layer and a soft magnetic layer may be stacked. In addition, a plurality of ferromagnetic layers may be stacked one on top of another through soft magnetic layers or nonmagnetic layers. Effects according to an embodiment can be obtained by using any of such stacked structures.

When the plurality of the ferromagnetic layers is stacked through nonmagnetic layers, the strength of an interaction between ferromagnetic layers can be adjusted. Thus, even the dimensions of the memory device become the order of submicrons or less, an effect of preventing the amount of magnetization reversing current from increasing can be attained.

In this case, the material of the nonmagnetic layer used may be Ru, Os, Re, Ir, Au, Ag, Cu, Al, Bi, Si, B, C, Cr, Ta, Pd, Pt, Zr, Hf, W, Mo, Nb(s), or any of those alloys.

It is desirable that each of the fixed-magnetization layer and the memory layer has anisotropy in one direction.

Furthermore, the film thickness of each of the fixed-magnetization layer and the memory layer is preferably in the range of 1 nm to 30 nm.

The other configuration of the memory device may have the same configuration of a memory device known in the art for recording information with a spin injection.

The fixed-magnetization layer may be only formed of a ferromagnetic layer or may be one with a fixed magnetization direction using an anti-ferromagnetic coupling between an anti-ferromagnetic layer and a ferromagnetic layer.

In addition, the fixed-magnetization layer may be formed of a single ferromagnetic layer or may be formed of a stacked ferrimagnetic structure including a plurality of ferromagnetic layers stacked through nonmagnetic layers.

When the fixed-magnetization layer is made of the stacked ferrimagnetic structure, the fixed-magnetization layer has a decreased sensitivity to an external magnetic field. An unnecessary magnetization change of the fixed-magnetization layer with an external magnetic field is prevented to allow the memory device to stably operate. Furthermore, the film thickness of each ferromagnetic layer can be adjusted, thereby preventing the fixed-magnetization layer from causing a leakage field.

The material of the ferromagnetic layer that forms the fixed-magnetization layer with the stacked ferrimagnetic structure may be Co, CoFe, CoFeB, or the like. In addition, the material of the nonmagnetic layer may be Ru, Re, Ir, Os, or the like.

The material of the anti-ferromagnetic layer may be any of magnetic materials, such as a FeMn alloy, a PtMn alloy, a PtCrMn alloy, a NiMn alloy, an IrMn alloy, NiO, and $Fe_2O_3$.

In addition, a nonmagnetic element, such as Ag, Cu, Au, Al, Si, Bi, Ta, B, C, O, N, Pd, Pt, Zr, Hf, Ir, W, Mo, or Nb may be added to any of these magnetic materials to adjust its magnetic characteristics or adjust any of various physical characteristics, such as other crystal structure, crystalline characteristics, or the stability of a material.

In addition, the memory device may have a film structure in which a memory layer is arranged above the fixed-magnetization layer. Alternatively, the memory layer may be arranged below the fixed-magnetization layer.

Furthermore, the information recorded on the memory layer of the memory device may be read as follows. A magnetic layer, the basis of information, may be provided on the memory layer of the memory device through a thin insulating film to read the information by the flow of a ferromagnetic tunnel current through an insulating layer. Alternatively, it may be read by a magnetoresistive.

Figure 4:
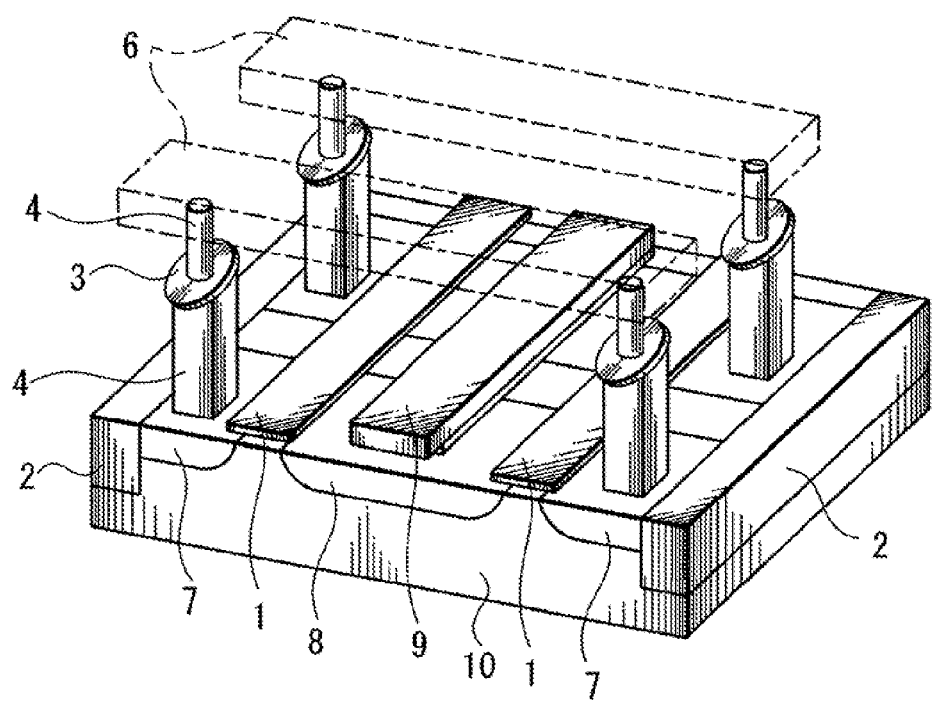
FIG. 4 is a schematic perspective diagram illustrating the configuration of a memory according to an embodiment.

FIG. 4 is a schematic perspective diagram illustrating the configuration of a memory according to an embodiment.

The memory includes a memory device that retains information based on its magnetization state and is arranged in the vicinity of the intersection between two different address wiring lines (e.g., a word line and a bit line) perpendicular to each other.

In other words, a drain region 8, a source region 7, and a gate electrode 1, which constitute a selection transistor for selecting each memory cell, are respectively formed on a portion separated by a device-separating layer 2 of a semiconductor substrate 10, such as a silicon substrate. Among them, the gate electrode 1 also serves as one (e.g., a word line) of the address wiring lines extending in the depth direction as shown in FIG. 4.

The drain region 8 is formed in common for selection transistors located on the right and left sides in the drawing. In addition, the drain region 8 is connected to a wiring line 9.

Furthermore, a memory device 3 is arranged between the source region 7 and the other address wiring line (e.g., a bit line). The address wiring line is located above the memory device 3 and extends in the traverse direction as shown in FIG. 4. The memory device 3 includes a memory layer formed of a ferromagnetic layer in which a magnetization direction can be reversed with a spin injection.

In addition, the memory device 3 is arranged in the vicinity of the intersection between two different address wiring lines 1, 6.

The memory device 3 is connected to both the bit line 6 and the source region 7 through upper and lower contact layers 4, respectively.

Therefore, the magnetization direction can be reversed with a spin injection by feeding electric currents to the memory device in the vertical direction through two different address wiring lines 1, 6.

Figure 5:
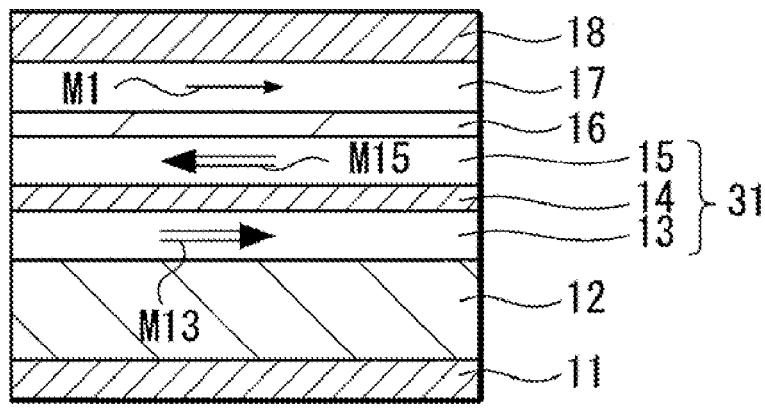
FIG. 5 is a cross sectional view of the memory device illustrated in FIG. 4.

FIG. 5 is a cross sectional view of the memory device 3 of the memory according to an embodiment.

As shown in FIG. 5, the memory device 3 includes a fixed-magnetization layer 31 under the memory layer 17 where the direction of magnetization Ml is reversed with a spin injection. In addition, an anti-ferromagnetic layer 12 is formed under the fixed-magnetization layer 31. The magnetization direction of the fixed-magnetization layer 31 is fixed by the anti-ferromagnetic layer 12.

An insulating layer 16 formed of a tunnel barrier layer (tunnel insulating layer) is provided between the memory layer 17 and the fixed-magnetization layer 31. The memory layer 17 and the fixed-magnetization layer 31 constitute a MTJ device.

In addition, a foundation layer 11 is formed under the anti-ferromagnetic layer 12. A capping layer 18 is formed on the memory layer 17.

The fixed-magnetization layer 31 has a stacked ferrimagnetic structure.

Specifically, the fixed-magnetization layer 31 is formed of two ferromagnetic layers 13, 15 which are stacked with each other through a nonmagnetic layer 14 using anti-ferromagnetic coupling.

Each of the ferromagnetic layers 13, 15 of the fixed-magnetization layer 31 has a stacked ferrimagnetic structure. Thus, the magnetization M13 of the ferromagnetic layer 13 is directed to the right side and the magnetization M15 of the ferromagnetic layer 15 is directed to the left side. Thus, both the layers are directed in the opposite directions to each other. Therefore, the magnetic fluxes leaked from the respective ferromagnetic layers 13, 15 of the fixed-magnetization layer 31 cancel each other out.

The materials of the respective ferromagnetic layers 13, 15 of the fixed-magnetization layer 31 include, but not particularly limited to, alloy materials of one or two or more selected from iron, nickel, and cobalt. Furthermore, any of transition metal elements, such as Nb, Zr, Gd, Ta, Ti, Mo, Mn, and Cu, and light elements, such as Si, B, and C may be included. Furthermore, the ferromagnetic layers 13, 15 may be formed such that two or more films made of different materials are directly stacked on top of another (without a nonmagnetic layer), such as a stacked layer of CoFe/NiFe/CoFe. The material of the nonmagnetic layer 14, which forms a stacked ferrimagnetic structure of the fixed-magnetization layer 31, may be any of ruthenium, copper, chromium, gold, silver and the like.

According to an embodiment, in particular, the memory layer 17 of the memory device 3 is configured so that the level of effective demagnetizing field received by the memory layer 17 can be smaller than the saturation-magnetization level Ms of the memory layer 17.

In other words, as described above, the level of effective demagnetizing field received by the memory layer 17 may be lowered by providing the memory layer 17 with the composition of a ferromagnetic material or a ferromagnetic material with a nonmagnetic material added thereto. Thus, the level of effective demagnetizing field can be lower than the saturation-magnetization level Ms of the memory layer 17.

The specific configuration of the memory layer 17 may be as follows:

For example, the memory layer 17 may be formed of a CoFe alloy or a CoFeB alloy in which the amount of Fe is large but the amount of Co is small.

Alternatively, in the memory layer 17, a nonmagnetic material element, such as Cr, Ta or Hf, or a nonmagnetic alloy thereof, or nonmetal nonmagnetic material, such as MgO or $Ta_2O_5$ is added to a ferromagnetic material (e.g., CoFe alloy or CoFeB alloy).

Furthermore, according to an embodiment, when the insulating layer 16 provided as an intermediate layer is formed of a magnesium oxide layer, the rate of magnetic resistance change (MR ratio) can be increased.

A high MR ratio is attained as described above to improve the efficiency of a spin injection, thereby reducing the electric current density for reversing the direction of the magnetization M1 of the memory layer 17.

The memory device 3 according to this embodiment may be prepared as follows. First, a vacuum apparatus is used to continuously form the layers from the foundation layer 11 to the capping layer 18. Subsequently, the pattern of the memory device 3 is formed by etching or using other process.

According to an embodiment, the memory layer 17 of the memory device 3 is configured so that the level of effective demagnetizing field received by the memory layer 17 can be smaller than the saturation-magnetization level Ms of the memory layer 17. Thus, the demagnetizing field to be received by the memory layer 17 is low. Thus, the amount of a writing electric current, which may be required for reversing the direction of magnetization M1 of the memory layer 17, can be reduced.

On the other hand, even without a decrease in the saturation-magnetization level Ms of the memory layer 17, the amount of a writing electric current can be reduced. Thus, sufficient thermal stability of the memory layer 17 can be obtained with a sufficient saturation-magnetization level Ms of the memory layer 17.

As described above, the thermal stability, which represents an ability of retaining information, can be sufficiently obtained. Thus, the memory device 3 having excellently balanced characteristics can be obtained.

Consequently, the memory device 3 can be prevented from causing an operation error, thereby obtaining a sufficient operation margin thereof. Thus, a reliable memory, which can be stably operated, can be obtained.

In addition, the writing electric current can be reduced to lower a consumption power for writing on the memory device 3.

Therefore, the power consumption of the memory device 3 in writing can be reduced by lowering the amount of a writing electric current. Thus, the consumption power of the whole memory can be reduced.

Therefore, a reliable memory having excellent characteristics of retaining information, which can be stably operated, can be obtained. The consumption power of a memory including the memory device 3 can be reduced.

Furthermore, a memory having the memory device 3 shown in FIG. 5 and configured as shown in FIG. 4 has an advantage in that a typical semiconductor MOS-forming process can be applied in the production of the memory.

Therefore, the memory according to this embodiment may be employed as a general-purpose memory.

Figure 6:
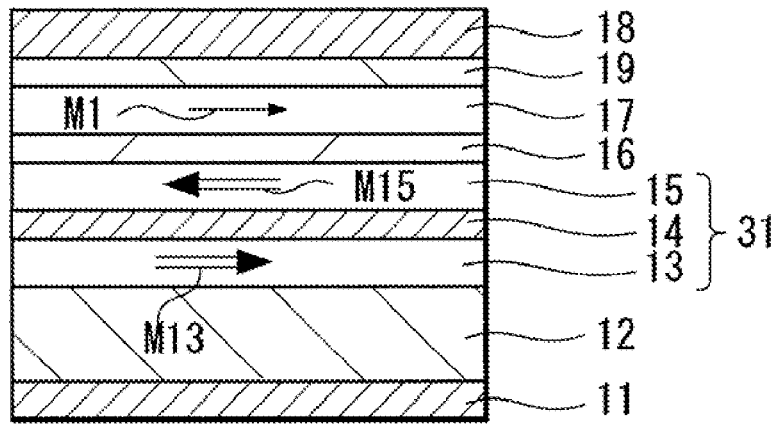
FIG. 6 is a cross sectional view of a memory device according to another embodiment.

Next, FIG. 6 is a cross-sectional view of a memory device according to another embodiment. In particular, a memory device 20 according to this embodiment includes a nonmagnetic layer 19 made of a nonmagnetic metal or a nonmagnetic oxide between a memory layer 17 and a capping layer 18 as shown in FIG. 6. The nonmagnetic layer 19 has a property of lowering the degree of the effective demagnetizing field received by the memory layer 17.

The nonmagnetic material used in the nonmagnetic layer 19 may be preferably ruthenium (Ru), magnesium oxide (MgO), aluminum oxide (Al—O; $Al_2O_3$ or any of other aluminum oxide), or the like.

Other configuration of the memory device will be the same as those of the memory device 1 shown in FIG. 5. Thus, the same reference numerals are given and duplicated description is omitted.

The memory device 20 shown in FIG. 6 according to this embodiment is used to prepare a memory having a similar configuration to that shown in FIG. 4.

According to an embodiment, the nonmagnetic layer 19 made of a nonmagnetic metal or a nonmagnetic oxide is provided between the memory layer 17 and the capping layer 18 of the memory device 20. The nonmagnetic layer 19 has a property of lowering the degree of an effective demagnetizing field received by the memory layer 17. Therefore, the demagnetizing field received by the memory layer 17 is lowered. Thus, the amount of a writing electric current for reversing the direction of magnetization M1 of the memory layer 17 can be reduced.

On the other hand, without lowering the saturation-magnetization level Ms of the memory layer 17, the amount of a writing electric current can be reduced. Thus, a sufficient saturation-magnetization level Ms of the memory layer 17 can be obtained, so that the thermal stability of the memory layer 17 is secured sufficiently.

As a result, the memory device 20 having excellently balanced characteristics similar to the case according to the previous embodiment can be obtained. The memory device 20 can be prevented from causing an operation error and obtain a sufficient operation margin thereof, thereby allowing the memory device 20 to be stably operated.

Thus, a reliable memory, which can be stably operated, can be obtained.

Furthermore, the consumption power of the memory device 20 in writing can be reduced by lowering the writing electric current.

Therefore, a memory including memory cells each formed of the memory device 20 of this embodiment is able to reduce the consumption power of the whole memory.

Therefore, a reliable memory having excellent characteristics of retaining information, which can be stably operated, can be obtained. The consumption power of a memory including the memory device 20 can be reduced.

EXAMPLES

With the configuration of the memory device according to an embodiment, a memory device was prepared as a sample. That is, the memory device was prepared by adjusting the level of effective demagnetizing field received by the memory layer. Such an adjustment was carried out by specifically selecting the material of the ferromagnetic layer that constitutes a memory layer or selecting the material of the layer adjacent to the memory layer. Then, the characteristics of the memory device were studied.

The actual configuration of the memory includes a semiconductor circuit for switching and so on in addition to the memory device, as shown in FIG. 4. Here, for the purpose of studying the characteristics of reversing the magnetization direction of the memory layer, a study was carried out on a wafer on which only a memory device was formed.

Experiment 1

A thermally-oxidized film with a thickness of 300 nm was formed on a silicon substrate with a thickness of 0.725 mm and a memory device 3 configured as shown in FIG. 5 was then formed thereon.

Specifically, in the configuration of the memory device 3 illustrated in FIG. 5, the material and the film thickness of each layer were defined as follows. A foundation film 11 was a Ta film with a film thickness of 10 nm. An anti-ferromagnetic layer 12 was a PtMn film with a film thickness of 20 nm. A ferromagnetic layer 13 that constitutes a fixed-magnetization layer 31 was a CoFe film with a film thickness of 2 nm and a ferromagnetic layer 15 was a CoFeB film with a film thickness of 2.5 nm. In addition, a nonmagnetic layer 14 of the fixed-magnetization layer 31 in stacked ferrimagnetic structure was a Ru film with a film thickness of 0.8 nm. An insulating layer (barrier layer) 16 acting as a tunnel insulating layer was a magnesium oxide film with a film thickness of 0.9 nm. A memory layer 17 was a CoFeB film. A capping layer 18 was a Ta film with a film thickness of 5 nm. In addition, a Cu film (not shown, to be provided as a word line as described later) with a film thickness of 100 nm was formed between the foundation film 11 and the anti-ferromagnetic layer 12.

In the above film configuration of the memory device 3, the ferromagnetic layer of the memory layer 17 was made of a ternary alloy Co—Fe—B and a reduced film thickness of the ferromagnetic layer was then fixed to 2.0 nm. The composition ratio of the PtMn film was PT:Mn=50:50 (atom %). The composition ratio of the CoFe film was Co:Fe=90:10 (atom %).

The layers, except of the insulating layer 16 made of the magnesium oxide film, were prepared using a DC magnetron sputtering method, respectively.

The insulating layer 16 made of the magnesium oxide (MgO) film was prepared using a RF magnetron sputtering method, respectively.

Furthermore, after film formation of each layer in the memory device 3, a heat treatment was carried out in a furnace for magnetic heat treatment with a magnetic field of 10 kOe at 360° C. for 2 hours to allow the PtMn film of the anti-ferromagnetic layer 12 to be subjected to a thermal ordering process.

Subsequently, after masking a word line portion by photolithography, a selective etching with Ar plasma was carried out on the stacked film other than the word line portion to form a word line (lower electrode). At this time, the portions except of the word line portion were etched to 5 nm in depth of the substrate.

Subsequently, a pattern mask of the memory device 3 was formed by an electron beam exposure system and a selective etching was then performed on stacked films, thereby forming the memory device 3. Portions other than the memory device 3 were etched to right above the Cu layer of the word line.

Furthermore, the memory device for evaluating the characteristics thereof may require a sufficient flow of an electric current to the memory device to generate a spin torque for the magnetization reversal. Thus, there may be a need of suppressing the resistance of a tunnel insulating layer. Consequently, the pattern of the memory device 3 was formed in an elliptical shape with a short axis of 0.09 μm and a long axis of 0.18 μm to provide the memory device 3 with an area resistance value ($\Omega\mu m^2$) of 20 $\Omega\mu m^2$.

Next, portions except of the memory device 3 were insulated by spattering with $Al_2O_3$ of about 100 nm in thickness.

After that, a bit line provided as an upper electrode and a pad for measurement were formed using photolithography.

As described above, the sample of the memory device 3 was prepared.

Furthermore, sample memory devices 3 were prepared by the above production process such that they had their respective compositions of Co—Fe—B alloy ferromagnetic layers of the memory layers 17.

Specifically, the composition ratio (atom %) of CoFe and B was fixed to 80:20 and the sample memory devices 3 had different composition ratios x (atom %) of Co in CoFe of 90%, 80%, 70%, 60%, 50%, 40%, 30%, 20%, and 10%, respectively.

Furthermore, each sample of the memory devices 3 thus prepared was subjected to the following characteristic evaluation. Prior to the measurement, the memory device 3 is allowed to be provided with an external magnetic field so that the reversed electric currents in plus and minus directions would be symmetrical with each other. In addition, a voltage applied to the memory device 3 was designed to one volt (1 V) where the insulating layer 16 could be prevented from being destroyed.

Measurement of Saturation-Magnetization Level

The saturation-magnetization level Ms was determined by a so-called VSM assay with a vibrating sample magnetometer (VSM).

(Measurement of Effective Demagnetizing Field)

Apart from the samples of the memory device 3, the respective layers that form the memory device 3 were prepared and a sample was then prepared by forming the respective layers on a plane pattern of 20 mm×20 mm square.

Furthermore, a ferromagnetic resonance (FMR) measurement was used to obtain the level of effective demagnetizing field $M_{effective}$.

Resonant frequency $f_{FMR}$ to an optional external magnetic field $H_{ex}$ obtained by the FMR measurement was given by the following formula (3):

$$f_{FMR} = \gamma \sqrt{4\pi M_{effective}(H_K + H_{ex})} \quad (3)$$

wherein $M_{effective}$ represents $4\pi M_{effective} = 4\pi Ms - H^\perp$ ($H^\perp$: anisotropy field in the direction perpendicular to the film surface).

Measurement of Amount of Reversed Electric Current and Thermal Stability

The measurement of the amount of reversed electric current was carried out for the purpose of evaluating the writing characteristics of the memory device according to an embodiment.

An electric current with a pulse width of 10 μs to 100 ms was fed to the memory device 3 and the resistance of the memory device 3 was then measured. Furthermore, the amount of an electric current passing through the memory device 3 was changed. The amount of an electric current required for reversing the direction of magnetization M1 of the memory layer 17 in the memory device 3 was obtained. The pulse-width dependency of the amount of an electric current was extrapolated to a pulse width of 1 ns and then provided as the amount of the reversed electric current.

In addition, the slope of the pulse-width dependency of the amount of the reversed electric current corresponds to the index (Δ) of the above thermal stability of the memory device 3. The memory device 3 is strong to thermal disturbance as much as the amount of the reversed electric current is not changed by a pulse width (as much as the slope is small).

Furthermore, in consideration of variations in memory devices 3, almost twenty memory devices 3 having the same configuration were prepared and then subjected to the above measurement. The average of the indexes Δ of thermal stability and the average of the amounts of the reversed electric currents were obtained, respectively.

Furthermore, a reversed electric current density $Jc_0$ was calculated from the average of the amount of the reversed electric current as determined by the measurement and the area of flat plane pattern of the memory device 3.

For each sample of the memory device 3, Table 1 represents the composition of a Co—Fe—B alloy of the memory layer 17 and the measurement results of both the saturation-magnetization level Ms and the level of effective demagnetizing field $M_{effective}$. In Table 1, furthermore, the ratio of the saturation-magnetization level to the level of effective demagnetizing field ($MS/M_{effective}$) is also represented.

TABLE 1

|  | Ms(emu/cc) | Meffctive(emu/cc) | Ms/Meffective |
|---|---|---|---|
| $(Co_{90}Fe_{10})_{80}$—$B_{20}$ | 960 | 1210 | 0.79 |
| $(Co_{80}Fe_{20})_{80}$—$B_{20}$ | 960 | 1010 | 0.95 |
| $(Co_{70}Fe_{30})_{80}$—$B_{20}$ | 1040 | 900 | 1.16 |
| $(Co_{60}Fe_{40})_{80}$—$B_{20}$ | 1200 | 760 | 1.58 |
| $(Co_{50}Fe_{50})_{80}$—$B_{20}$ | 1300 | 690 | 1.88 |
| $(Co_{40}Fe_{60})_{80}$—$B_{20}$ | 1300 | 500 | 2.60 |
| $(Co_{30}Fe_{70})_{80}$—$B_{20}$ | 1260 | 390 | 3.23 |
| $(Co_{20}Fe_{80})_{80}$—$B_{20}$ | 1230 | 360 | 3.42 |
| $(Co_{10}Fe_{90})_{80}$—$B_{20}$ | 1200 | 345 | 3.48 |

Figure 7:
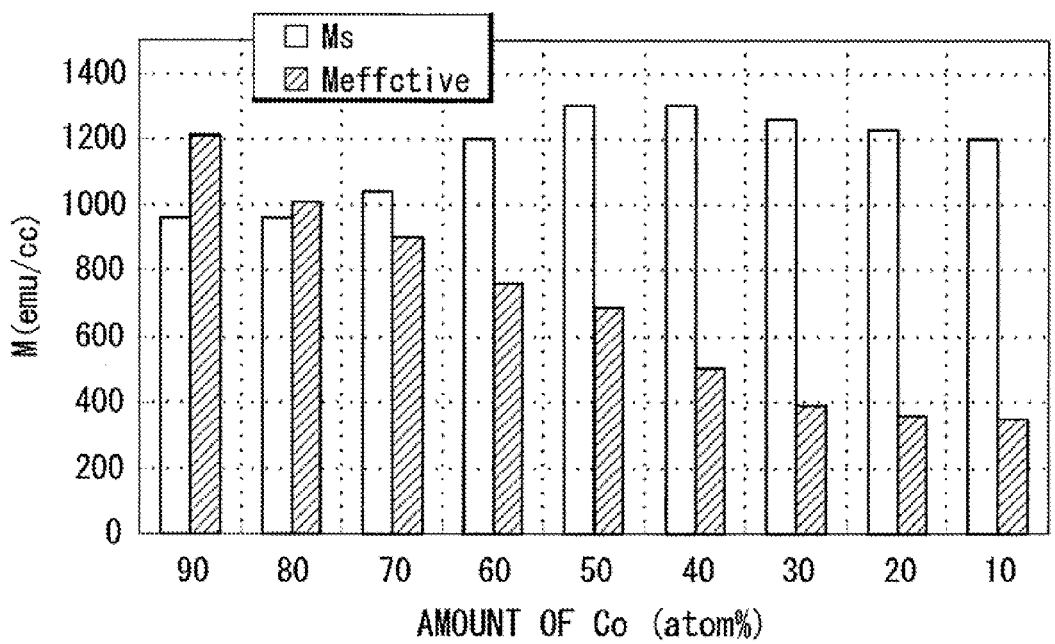
FIG. 7 is a graphic representation illustrating the relationship between the amount of Co in a memory layer and a saturation-magnetization level and effective demagnetizing field.

The measurement results of the saturation-magnetization level Ms and the level of effective demagnetizing field $M_{effective}$ shown in Table 1 are represented by the bar graph in FIG. 7. FIG. 7 shows the relationship between the amount of Co in the Co—Fe—B alloy of the memory layer 17 (the content of Co in CoFe; atom %) and the saturation-magnetization level Ms and the level of effective demagnetizing field $M_{effective}$.

Figure 8:
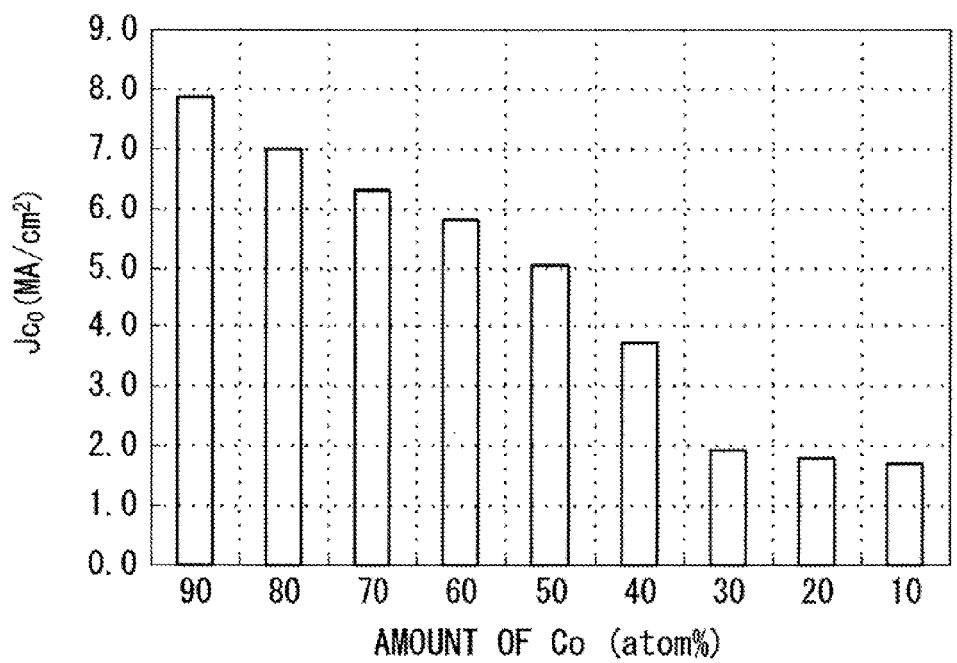
FIG. 8 is a graphic representation illustrating the relationship between the amount of Co in a memory layer and a reversed electric current density.
Figure 9:
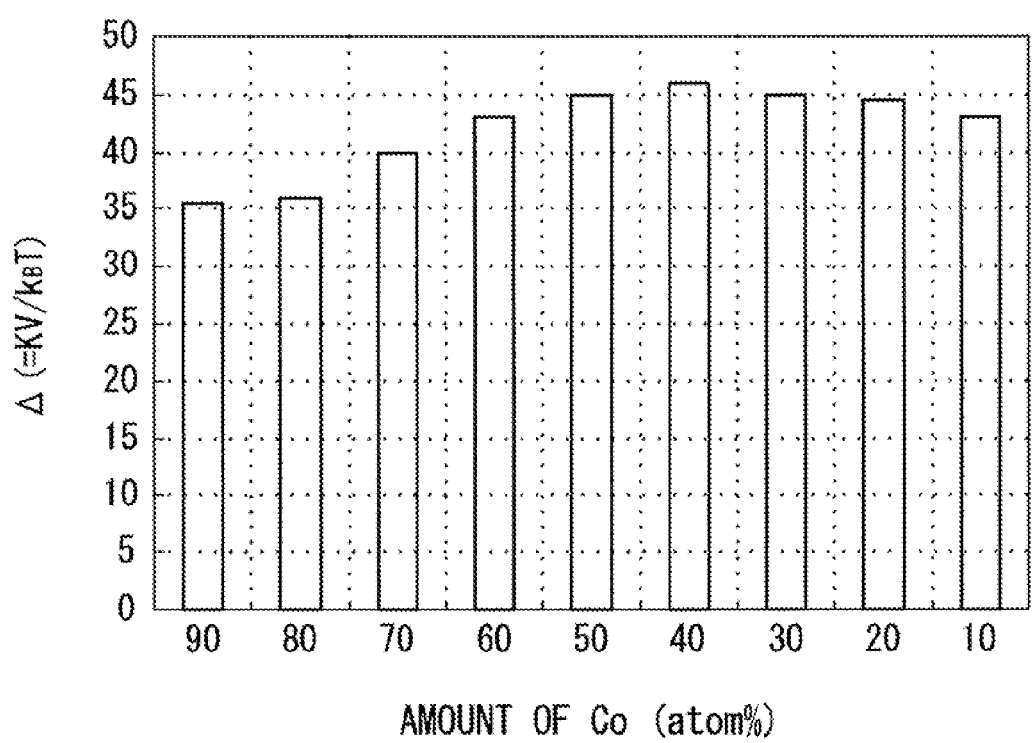
FIG. 9 is a graphic representation illustrating the relationship between the amount of Co in a memory layer and the index of thermal stability.

In addition, the measurement results of the amount of the reversed electric current are shown in FIG. 8 and the measurement results of the index of thermal stability are shown in FIG. 9. FIG. 8 shows the relationship between the amount of Co in the Co—Fe—B alloy of the memory layer 17 (the content of Co in CoFe; atom %) and the reversed electric current density $Jc_0$ obtained from the amount of the reversed electric current. FIG. 9 shows the relationship between the amount of Co in the Co—Fe—B alloy of the memory layer 17 (the content of Co in CoFe; atom %) and the index $\Delta(KV/k_BT)$ of thermal stability.

As shown in FIG. 7, the magnitude correlation between the saturation-magnetization level Ms and the effective demagnetizing field $M_{effective}$ is changed depending on the composition of Co—Fe—B. In a certain composition, the effective demagnetizing field $M_{effective}$ is smaller than the saturation-magnetization level Ms. Specifically, when the amount of Co(x) in $(Co_xFe_{100-x})_{80}B_{20}$ is 70% or less, $M_{effective}$ is smaller than Ms. Thus, the smaller the amount of Co(x) decreases, the more the difference between $M_{effective}$ and Ms increases.

As shown in FIG. 8, the smaller the amount of Co(x) decreases, the smaller the reversed electric current density $Jc_0$ decreases because of the follows. When the amount of Co(x) is small, the saturation-magnetization level Ms increases but the effective demagnetizing field $M_{effective}$ decreases. Thus, it is referred from a decrease in product of these factors (MS× $M_{effective}$).

As shown in FIG. 9, the smaller the amount of Co(x) decreases, the more the index $\Delta$ of thermal stability (=KV/$k_BT$) increases. Thus, it is found that the amount of Co(x) decreases to a certain level or smaller and the index $\Delta$ of thermal stability is stabilized at a higher level. It coincides well with an expected change because the measurement results of the saturation-magnetization level Ms shown in FIG. 7 and the index $\Delta$ of thermal stability are proportional to the saturation-magnetization level Ms from the equation (2).

As shown in the results of FIGS. 7 to 9, in the composition, when the amount of Co(x) is 70% or less at which the effective demagnetizing field $M_{effective}$ is smaller than the saturation-magnetization level Ms, the amount of the reversed electric current $Jc_0$ can be reduced while retaining a thermal stability higher than that of the composition in which an amount of Co(x) is more than 70%.

Furthermore, as shown in Table 1, the ratio Ms/$M_{effective}$ is 1.16 when an amount of Co(x) is 70%.

Thus, more preferably, the composition of the memory layer 17 is selected so that the ratio Ms/$M_{effective}$ can be 1.16 or more.

Experiment 2

A memory layer 17 was prepared using a material in which an additive was added to CoFeB. Then, the ratio (Ms/$M_{effective}$) of the saturation-magnetization level to the effective demagnetizing field is adjusted, followed by being subjected to the same measurement as that of Experiment 1.

Sample memory devices 3 were prepared in a manner similar to Experiment 1, except as follows: An additive (Cr, Ta, Hf, MgO, or $Ta_2O_5$) with a reduced film thickness of 0.1 nm was added to a CoFeB alloy in which the amount of Co(x) (atom %) was 70% in $(Co_xFe_{100-x})_{80}B_{20}$. Consequently, a memory layer 17 with a reduced film thickness of 2.0 nm.

For each sample of the memory devices 3 thus prepared, the saturation-magnetization level Ms, the effective demagnetizing field $M_{effective}$, and the amount of the reversed electric current were measured in a manner similar to Example 1.

As the measurement results, Table 2 shows the saturation-magnetization level Ms, the effective demagnetizing field $M_{effective}$, the ratio (Ms/$M_{effective}$) of the saturation-magnetization level and the effective demagnetizing field, and the reversed electric current density $Jc_0$ obtained from the amount of the reversed electric current. The measurement value obtained in the absence of any additive (–) measured in Experiment 1 is also represented in Table 2.

TABLE 2

| Additive | Ms(emu/cc) | Meffective(emu/cc) | Ms/Meffective | $Jc_0$(MA/cm²) |
|---|---|---|---|---|
| — | 1040 | 900 | 1.2 | 6.3 |
| Cr | 950 | 500 | 1.9 | 5.1 |
| Ta | 800 | 310 | 2.6 | 4.2 |
| Hf | 940 | 630 | 1.5 | 5.5 |
| MgO | 890 | 360 | 2.5 | 4.1 |
| $Ta_2O_5$ | 920 | 410 | 2.2 | 4.3 |

As shown in Table 2, it is found that the addition of an additive leads to decrease in the reversed electric current density $Jc_0$ 15% or more while improving the ratio (MS/$M_{effective}$) of the saturation-magnetization level and the effective demagnetizing field. In particular, when Ta or MgO was added, the reversed electric current density $Jc_0$ can be reduced to 30% or more in comparison with one obtained in the absence of an additive.

Furthermore, when Ta or MgO was added, the saturation-magnetization level Ms was decreased in comparison with one obtained in the absence of any additive. However, the anisotropy field $H_k$ was increased, so that the thermal stability could be equally retained based on the equation (2).

Experiment 3

As shown in FIG. 6, a nonmagnetic layer 19 was placed between the memory layer 17 and the capping layer 18 to adjust the level of effective demagnetizing field to be applied to the memory layer 17. Subsequently, the measurement was carried out in a manner similar to Experiment 1.

The composition of a CoFeB film in the memory layer 17 was fixed to $(Co_{70}Fe_{30})_{75}B_{25}$. This composition contains boron (B) slightly larger than the samples prepared in Experiments 1 and 2. Since the content of boron (B) is slightly large, so that the saturation-magnetization level Ms can be slightly decreased and the effective demagnetizing field $M_{effective}$ is slightly increased.

On the other hand, a nonmagnetic layer 19 with 1.0 µm in film thickness made of another nonmagnetic material (Cr, Ru, MgO, or Al—O) was formed between the CoFeB film of the memory layer 17 and the Ta film of the capping layer 18.

Others were similar to those of Experiment 1 and a sample of the memory device 20 with the configuration shown in FIG. 6 was then prepared.

Further, a sample memory device having a capping layer 18 directly formed on the memory layer 17 was prepared as a comparative example.

For each sample of the memory devices 3 thus prepared, the saturation-magnetization level Ms, the effective demagnetizing field $M_{effective}$, and the amount of the reversed electric current were measured in a manner similar to Example 1.

As the measurement results, Table 3 shows the saturation-magnetization level Ms, the effective demagnetizing field $M_{effective}$, the ratio (Ms/$M_{effective}$) of the saturation-magnetization level and the effective demagnetizing field, and the reversed electric current density $Jc_0$ obtained from the amount of the reversed electric current. A sample in which the capping layer 18 is directly formed on the memory layer 17 as a comparative example was represented as "Ta only" in Table 3.

TABLE 3

| Non-magnetic layer | Ms(emu/cc) | Meffctive(emu/cc) | Ms/Meffective | $Jc_0(MA/cm^2)$ |
|---|---|---|---|---|
| Ta only | 930 | 1020 | 0.91 | 5.9 |
| Cr | 950 | 1000 | 0.95 | 6 |
| Ru | 940 | 820 | 1.15 | 4.5 |
| MgO | 945 | 800 | 1.18 | 4.4 |
| Al—O | 1030 | 890 | 1.16 | 4.5 |

As shown in Table 3, when the capping layer 18 is directly formed on the memory layer 17 or the Cr layer is formed between the capping layer 18 and the memory layer 17, it is found that the ratio (Ms/$M_{effective}$) is 1 (one) or less and the reversed electric current density $Jc_0$ is large.

On the other hand, when the nonmagnetic layer 19 made of Ru, MgO, or Al—O is formed, the ratio (MS/$M_{effective}$) is high as much as 1.15 or more. Thus, it is found that the reversed electric current density $Jc_0$ is decreased to 20% or more in comparison with one on which the capping layer 18 is directly formed. Furthermore, in comparison with one on which the capping layer 18 is directly formed, the saturation-magnetization level of the memory layer 17 is equal. Thus, from the equation (2), the index Δ of thermal stability may be also equal.

In other words, the nonmagnetic layer 19 made of Ru, MgO, or Al—O is formed between the memory layer 17 and the capping layer 18, thereby lowering the reversed electric current density without decreasing thermal stability.

According to the above results, when the ratio Ms/$M_{effective}$ is in the range of 1.15 or more, a low reversed electric current density $Jc_0$ can be obtained without decreasing thermal stability.

In addition, the memory layer 17 is not limited to the above Co—Fe—B material. The memory layer 17 may be prepared using at least two materials selected from Co, Fe, and Ni in which one or more of elements including B, C, Si, N, Ta, Ti, Cr, W, Al, Mg, or O may be added. In this case, the effects as described in an embodiment can be obtained as long as the ratio Ms/$M_{effective}$ satisfies a predetermined condition.

Furthermore, when any of materials except of the above materials (Ru, MgO, and A—O) is inserted between the memory layer 17 and the capping layer 18, the effects as described in an embodiment can be obtained as long as the ratio Ms/$M_{effective}$ satisfies a predetermined condition.

According to an embodiment, the film configuration is not limited to those of the memory devices 3, 20 described in the respective embodiments. Any of various film configurations may be employed.

In each of the above embodiments, the fixed-magnetization layer 31 includes a stacked ferrimagnetic structure made of two ferromagnetic layers 13, 15 and a nonmagnetic layer 14. However, for example, the fixed-magnetization layer may be made of a single-layer ferromagnetic layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory device, comprising:
    a memory layer retaining information based on a magnetization state of a magnetic material; and
    a fixed-magnetization layer formed on the memory layer through an intermediate layer made of an insulating material,
    wherein the information is recorded on the memory layer with a change in a magnetization direction of the memory layer caused by injecting a spin-polarized electron in a stacked direction,
    wherein a level of effective demagnetizing field, which is received by the memory layer, is smaller than a saturation-magnetization level of magnetization of the memory layer, and
    wherein a ratio of a saturation-magnetization level of a ferromagnetic layer material in the memory layer to the level of the effective demagnetizing field is 1.15 or more.

* * * * *